United States Patent [19]
Afghahi

[11] Patent Number: 5,955,899
[45] Date of Patent: Sep. 21, 1999

[54] COMPACT COMPARATOR

[75] Inventor: Morteza Afghahi, Chandler, Ariz.

[73] Assignee: Intel Corporation, Santa Clara, Calif.

[21] Appl. No.: 08/789,006

[22] Filed: Jan. 27, 1997

[51] Int. Cl.[6] .............................. H03K 17/16; H03K 5/22
[52] U.S. Cl. ................................ 327/65; 327/63; 327/67; 327/544; 327/50; 327/563
[58] Field of Search .................... 327/50, 63, 65, 327/67, 53, 560, 544, 546, 538, 543, 562, 563

[56] References Cited

U.S. PATENT DOCUMENTS 4,814,648  3/1989  Hynecek .................................. 327/563
5,274,275  12/1993  Colles ...................................... 327/65

*Primary Examiner*—Dinh Le
*Attorney, Agent, or Firm*—Blakely, Sokoloff, Taylor & Zafman

[57] ABSTRACT

A compact electronic comparator circuit is featuring a single amplifier having two loads. The comparator is a symmetrical circuit having a pair of transistors to which positive and negative feedback loads are coupled so as to yield a constant infinite load. The comparator first amplifies the two input signals, and then operates as a regenerative latch in response to an external signal once the input signals have been sufficiently amplified. The comparator may be used in A/D converter and DRAM applications.

15 Claims, 5 Drawing Sheets

COMPACT COMPARATOR

BACKGROUND

This invention lies in the field of comparison of electronic or other types of signals. More specifically, this invention relates to electronic comparator circuits for high speed applications.

Typically, comparators have a positive (also called non-inverting) input and a negative (also called inverting) input for receiving the input voltages or currents, and an output voltage or current which indicates a high level if the positive input is greater than the negative input, and indicates a low level if the negative input is larger than the positive input. Some comparators also have an additional complimentary output.

Comparators find themselves as important components in many applications, including medium resolution (8–10 bits) Analog to Digital (A/D) converters, memory circuits such as Dynamic Random Access Memory (DRAM) and Static RAM, and Sigma-Delta A/D converters. In modern embedded circuit applications, such as the digital camera, reducing the physical size and the power consumption of fast comparators is of paramount importance due to the large number of comparators used. For example, circuits such as the DRAM, SRAM, and the CMOS imaging array may require one or two comparator circuits for each column. Thus, a typical 1024 by 1024 CMOS image array can require over two thousand comparator circuits for sensing the analog signal levels generated by the array. A reduction in size of the comparator will therefore reduce manufacturing costs and yield a more compact final product. Additionally, in a typical CMOS image array, each comparator will be part of an A/D converter for each column and will typically be called on to perform a comparison every 50 nanoseconds. Thus, a faster comparator will improve image resolution by allowing a greater number of image sensor columns to be sensed in a given period of time.

For high speed applications, a circuit known as a regenerative latch (also called a positive feedback latch) may be used to translate a small difference in the input signal levels into much larger output signal levels in a short period of time. Latches work well in implementing logic circuits such as the flip-flop. However, a latch cannot be used by itself as a comparator circuit when the input signal levels to be compared differ by less than the voltage required to toggle the latch. That is because the latch has only two stable states, such that the smallest difference between the two input signal levels will be enough to launch the outputs towards one of the two stable states. Even if the circuit elements in the latch were perfectly matched to yield zero input offset levels, the significant positive feedback in a latch will be enough to uncontrollably amplify the slightest and shortest noise spike at the inputs. To toggle the latch into another state, the difference in input levels must be greater than the latch toggle voltage. In a typical modern latch built using Metal Oxide Semiconductor (MOS) technology, this toggle voltage is approximately 30 mv. Thus, input signal levels differing by less than 30 mv will have no effect on the output of the latch.

One way to retain the fast and reliable switching characteristics of a latch when comparing two signals which differ by less than the toggle voltage is to use an amplifier stage in front of the latch. The input signals are first amplified to a level that is sufficient to overcome the latch toggle voltage. The amplified levels are then fed to the latch which will then be toggled into the correct output state.

The addition of a separate amplifier stage, however, results in more power consumption, requires greater physical area on the integrated circuit die, and will reduce the overall speed of the comparison because of the additional delay introduced by the separate amplifier stage. Therefore, a novel comparator circuit is needed to overcome some or all of these disadvantages.

SUMMARY

This invention is directed at a novel comparator circuit having a single amplifier stage for first amplifying two input signals and then for operating as a regenerative latch to yield an output comparison result. The amplifier has two loads, one presenting positive feedback, the other presenting negative feedback. The negative feedback load is controlled by an external signal. In response to the external signal, the negative feedback load is decoupled from the amplifier upon expiration of a first time, leaving the positive feedback load to finish the comparison.

DRAWINGS

DETAILED DESCRIPTION

Figure 1:
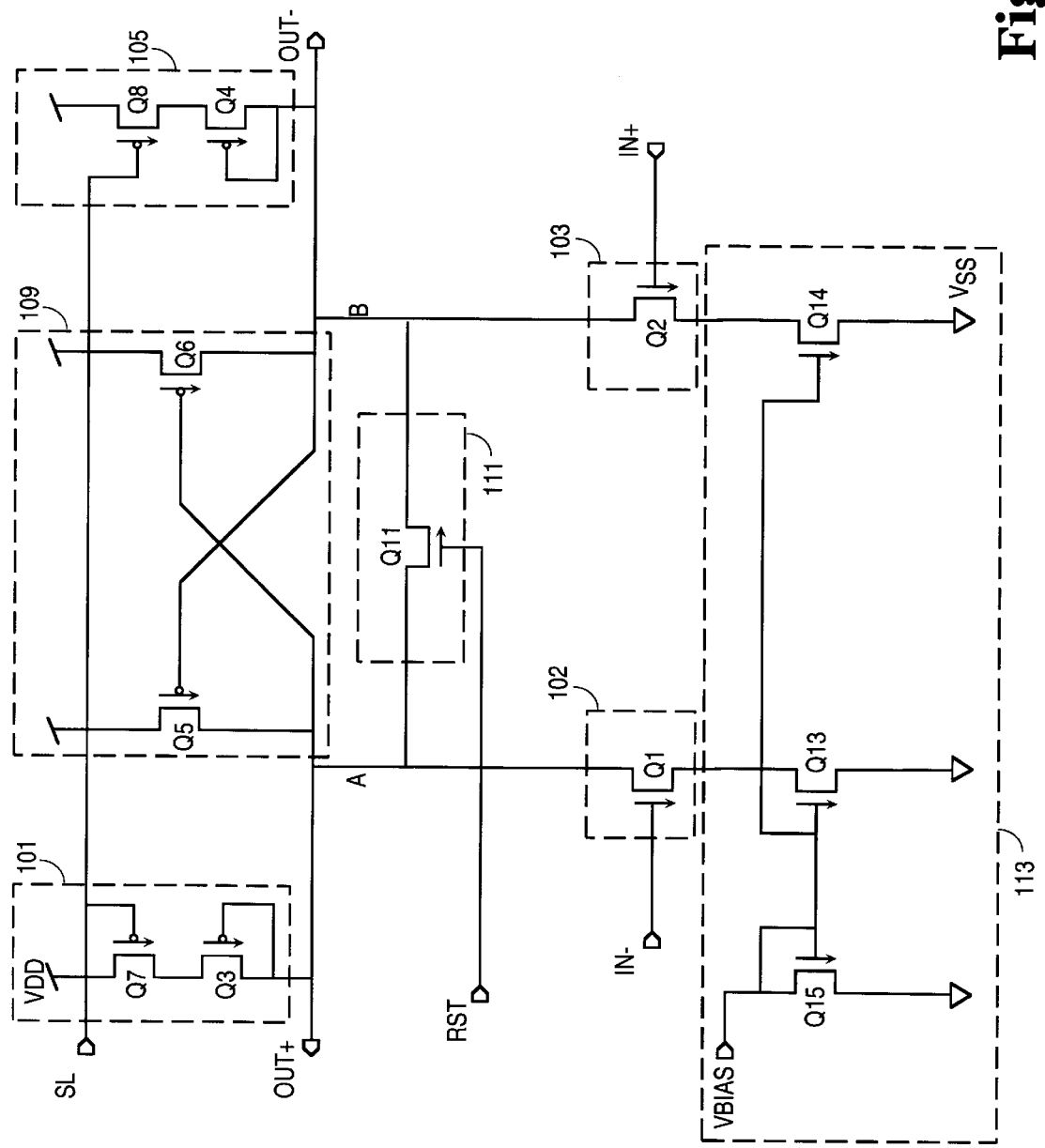
FIG. 1 is a first embodiment of a comparator circuit according to the invention.

FIG. 1 shows a first embodiment of the invention. The comparator circuit 100 has first and second amplifying units 102 and 103 for receiving input signals IN− and IN+, respectively. In the exemplary embodiment of FIG. 1, amplifying units 102 and 103 are identical n-MOS field effect transistors (FETs) Q1 and Q2, respectively. Q1 and Q2 receive IN− and IN+ at their respective gates. The respective drains of Q1 and Q2 connect to current nodes A and B at which the output signals OUT+ and OUT− are found. Bias network 113 is shown as coupling to the respective sources of Q1 and Q2. Bias network 113 in this embodiment contains identical n-MOS FETs Q13 and Q14 referenced to VSS. Completing the bias network 113 are input voltage VBIAS and n-MOS FET Q15 coupled to Q13 and Q14 for biasing the amplifying units 102 and 103.

FIG. 1 also includes first and second loads 101 and 105 that are coupled to nodes A and B. First and second loads 101 and 105 each receive set load signal SL which is generated external to the comparator circuit. The set load signal SL is used to couple and decouple the first and second loads 101 and 105 to their respective nodes A and B so as to affect the gain of the amplifying units 102 and 103.

Finally, a third load 109 couples to nodes A and B as shown. The third load 109 presents positive feedback to amplifying units 102 and 103.

The comparator circuit of FIG. 1 also includes a reset circuit 111 which couples nodes A and B. The reset circuit 111 receives an externally generated reset signal RST to equalize the output nodes A and B. In the embodiment of FIG. 1, raising the potential of reset signal RST creates a low impedance path through n-MOS FET Q11 between nodes A and B. The path should be sufficiently low in resistance so that output signals OUT+ and OUT− appear identical to an external sensing circuit.

Although in the embodiment of FIG. 1, loads 101, 105 and 109 are shown as separate loads, the comparator circuit can also be implemented as a single amplifier having two loads, a first load presented by the pair 101 and 105, and a second load presented by load 109. Indeed, the pair 101 and 105 are both controlled simultaneously by the external signal SL. Furthermore, amplifying units 102 and 103 can also be treated as a single amplifier unit, because both are necessary for proper functioning of the comparator circuit 100.

In the embodiment shown in FIG. 1, first load 101 comprises a pair of p-MOS FETs Q3 and Q7 connected serially as shown and referenced to VDD (the positive supply rail). Q7 acts as a switch in response to set load signal SL. When SL drops to VDD-$V_T$ where $V_T$ is the threshold voltage of the p-MOS FET used for Q7, Q7 will conduct so as to couple the first and second load devices to their respective nodes. Second load 105 is constructed and operates in the same way as the first load 101, including a pair of p-MOS FETs Q4 and Q8 corresponding to Q3 and Q7, respectively. Q3 and Q4 have their gates connected to their respective drains in order to create negative feedback for amplifying units 102 and 103.

The third load 109 is represented as p-MOS FETs Q5 and Q6 cross connected as a bistable circuit across nodes A and B. As will be described below, third load 109 presents positive feedback to amplifying units 102 and 103. Moreover, the combination of positive and negative feedback presented by the pair Q3 and Q4 (when conducting) and the pair Q5 and Q6 as shown in FIG. 1 results in a constant infinite load for amplifying units 102 and 103.

Bias network 113 completes the circuit of FIG. 1 and will typically include n-MOS transistors Q13 and Q14 connected as shown. Conventional voltage limiting device Q15 also appears as an n-MOS FET receiving an external input bias voltage VBIAS at its drain. A larger VBIAS will result in greater current through devices Q13 and Q14 which in turn results in increased power consumption but greater operating speed for the amplifying units 102 and 103.

The exemplary embodiment of FIG. 1 will typically be implemented as part of a semiconductor integrated circuit where n-MOS FETs Q1 and Q2 have a typical width-to-length (W/L) ratio of 6.4/2.8, p-MOS FETs Q3 and Q4 have a typical W/L ratio of 2.4/2.4, Q5 and Q6 have a W/L ratio of 2.4/2.4, and Q7 and Q8 have a W/L ratio of 2.8/1.4. Reset device Q11 has a W/L ratio of 2.4/1.2, and bias devices Q13 and Q14 have the ratio 4.4/2.4, where all units are in microMeters.

The above W/L ratios are selected to minimize power usage by the circuit, yet also allow the switching devices to adequately turn on and conduct sufficient current as well as turn off. The mentioned transistors should be selected so as to minimize loading capacitances, typically done by selecting overall smaller dimensions for the transistors and by adjusting the W/L ratio for each.

The circuit of FIG. 1 will typically operate with VDD in the range 1.5 Volts to the maximum voltage sustainable by devices Q1 and Q2 with respect to VSS. The preferred range for IN+ and IN− will be between $V_T$ and VDD, where $V_T$ is the threshold voltage for n-MOS FET Q1 or Q2, typically 0.5 to 0.8 Volts. If it is desired to compare signals with a common mode level smaller than $V_T$, then n-MOS devices Q1 and Q2 must be replaced with p-MOS devices which allow a comparison of IN+ and IN− in the range VSS to VDD-$V_T$.

By providing a pair of current nodes A and B to which a positive feedback load and a negative feedback load are connected so as to present a constant infinite load for a short period of time, the comparator circuit of this invention combines the stable amplification characteristics of an amplifier with the high speed and reliable switching advantages of a bistable circuit having positive feedback as discussed below, all by using only eleven (11) transistors, excluding conventional voltage limiting device Q15, in the exemplary embodiment of FIG. 1.

Figure 2:
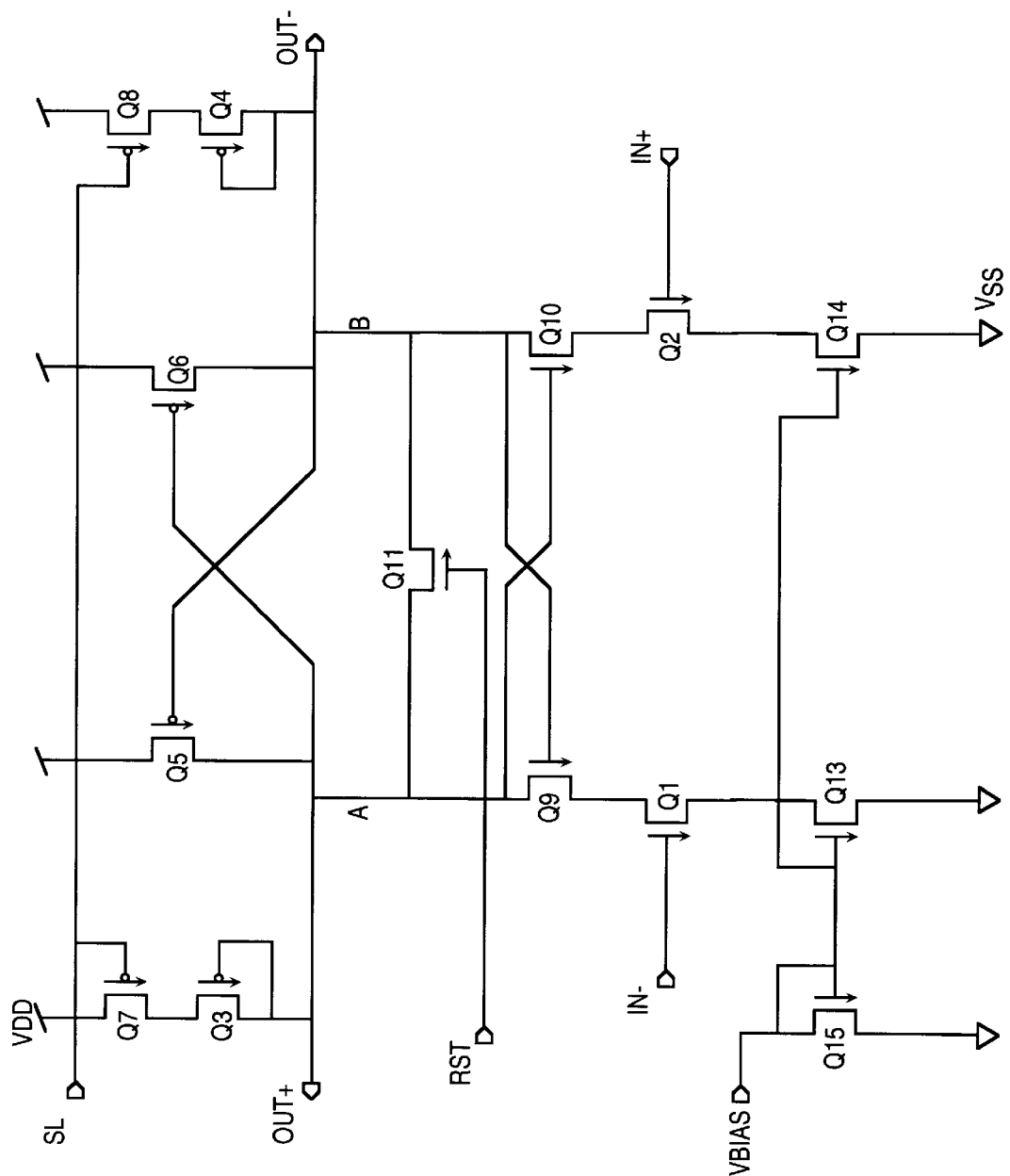
FIG. 2 is a second embodiment of a comparator circuit according to the invention.

FIG. 2 shows a second embodiment of this invention wherein power saving devices Q9 and Q10 are added in series with Q1 and Q2. The gates of transistors Q9 and Q10 are cross connected to the opposite current node. As shown in FIG. 2, Q9 and Q10 are n-MOS FETs connecting the drains of the input transistors Q1 and Q2 to their respective current nodes A and B. In a typical embodiment, Q9 and Q10 have a W/L ratio of 3/2.4 such that the DC current through either Q1 or Q2 is the lowest possible when the circuit of Q5 and Q6 has reached a stable state. As such, devices Q9 and Q10 serve to reduce power consumption in the comparator circuit.

Figure 3:
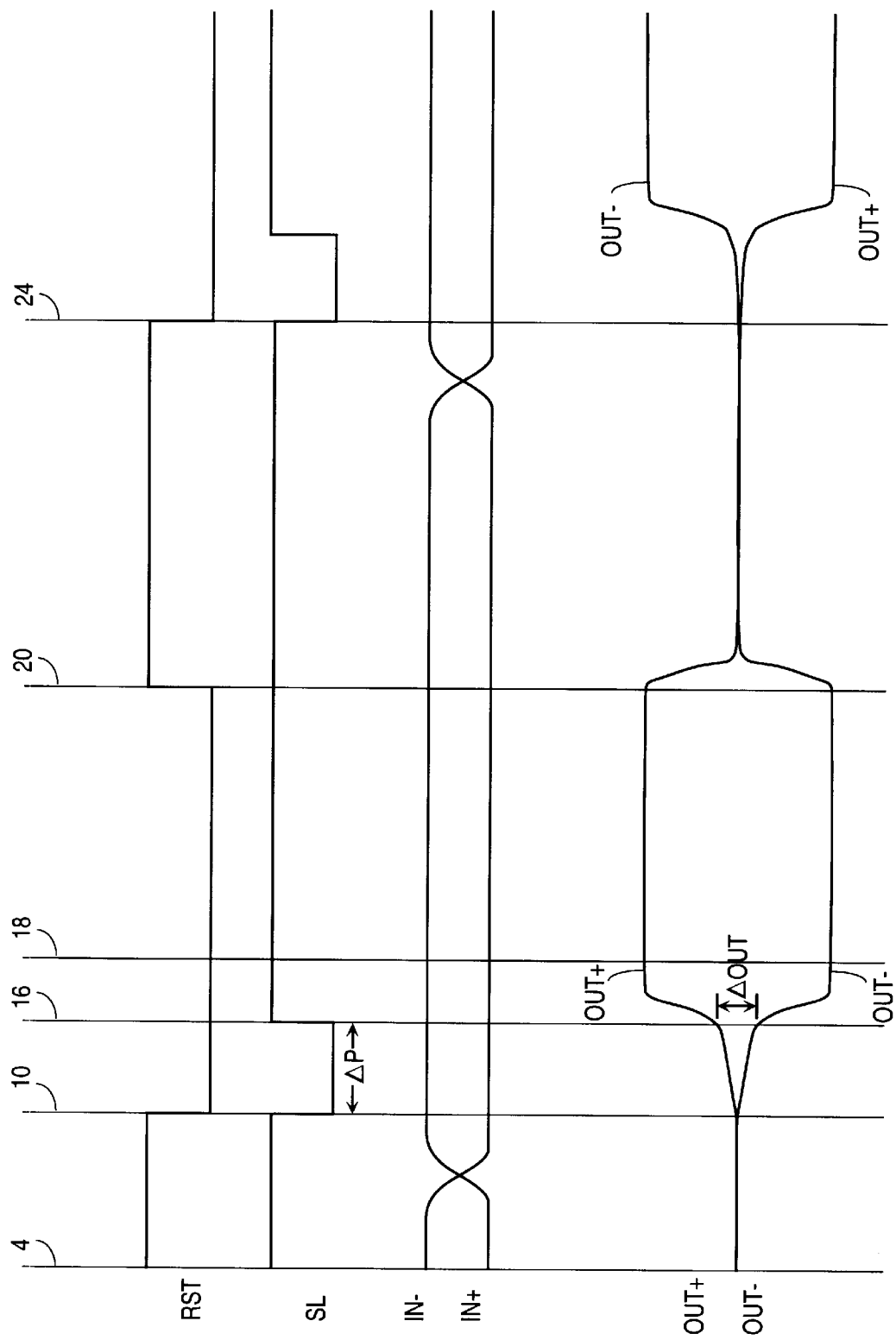
FIG. 3 is a timing diagram for using the comparator circuit according to an embodiment of the invention.

The operation of comparator circuit 100 of FIG. 1 is represented by the timing diagram in FIG. 3. FIG. 3 (not drawn to scale) shows six waveforms associated with the comparator circuit 100 as a function of time, including RST, SL, IN+, IN−, OUT+, and OUT−. The wave forms RST and SL can be generated in accordance with conventional techniques known in the art.

Upon power-up, just before time 4, the bistable circuit of Q5 and Q6 triggers itself due to the slightest mismatch between the transistors Q5 and Q6, or the slightest difference in voltage at nodes A and B. Thus, if node A is of slightly higher potential than node B, then Q5 will conduct more than Q6. This will raise the potential at node A even higher, while decreasing the potential at node B. As the potential at node B decreases, Q5 can conduct even more current at a smaller drain-source voltage drop resulting in a further increase of the potential at node A. This behavior is typical of a bistable circuit having positive feedback.

The bistable circuit of Q5 and Q6, therefore, immediately acts to drive nodes A and B to one of two possible states. This action, however, is interrupted by the rising of RST which equalizes the voltage at the two output nodes as shown in the single trace for OUT+ and OUT− prior to time 10. If the difference between IN+ and IN− were smaller than the voltage required to toggle the bistable circuit of Q5 and Q6, then, without the equalization, the positive feedback from the bistable circuit would have driven nodes A and B to perhaps an incorrect state given the absolute difference between inputs IN+ and IN−.

After inputs IN− and IN+ are established, just prior to time 10, RST is lowered at time 10 which releases the output nodes. Also, set load signal SL is dropped at approximately the same time as RST is dropped, substantially turning on devices Q7 and Q8. This in turn couples Q3 and Q4 as loads to Q1 and Q2, respectively. The addition of devices Q3 and Q4 in effect slows down the amplifier presented by Q1 and Q2 and its positive feedback load, i.e., the bistable circuit of Q5 and Q6. For example, if Q5 were beginning to conduct upon power-up, the addition of the path through device Q4 will raise the potential at node B up towards $V_{DD}-V_{SD}(Q8)-V_{SD}(Q4) \cong V_{DD}-^2V_{SD}$ where $V_{SD}(Q4)$ is the source-drain voltage difference of device Q4 and $V_{SD}(Q8)$ is the source-drain voltage difference of Q8, thereby tending to cut off device Q5. This slows down the increase in potential of node A. To be effective, the addition of negative feedback through Q3 and Q4 must occur before the potential at node A has reached $V_{DD}-2V_{SD}$. This is assured by lowering RST at approximately the same time as SL is lowered, i.e., at time 10.

Beginning at time 10, input signals IN+ and IN− are stable such that between times 10 and 16, OUT+ and OUT− diverge towards opposite directions due to amplification by Q1 and Q2 with loads 101, 105 and 109 in place. If IN+ were greater than IN−, node B would tend to be pulled down to a lower potential than node A as shown by the diverging output signals OUT+ and OUT−. When OUT+ and OUT− have sufficiently diverged to overcome the toggle voltage of the bistable circuit in third load 109, set load signal SL is raised at time 16 thereby removing the negative feedback through Q3 and Q4. In the exemplary embodiment of FIG. 1, this should occur when ΔOUT=|OUT+−OUT−| has increased to approximately 30 millivolts. Raising SL decouples the negative feedback such that the positive feedback in third load 109 takes over, quickly driving OUT+ to a potential much higher than OUT−. The change in load to amplifying units 102 and 103 is reflected by the different slopes for OUT+ and OUT− in FIG. 3 before and after time 16. Therefore, OUT+ rises to a stable state higher than OUT−, consistent with IN+ being larger than IN−. Once the outputs have reached their stable states, OUT+ and OUT− can be read by an external circuit between time 18 and time 20. The entire process described above can be repeated beginning at time 24 for another comparison of IN+ and IN−.

The time interval ΔP from 10 to 16 during which SL is kept low can be obtained by simulating the comparator circuit using conventional computer-aided design tools. In the embodiment of FIG. 1, ΔP is approximately 2 nanoseconds which will allow an input signal difference |IN+−IN−| of 1 millivolt to develop into a ΔOUT of approximately 30 millivolts or more, as shown in FIG. 3.

When the comparator circuit 100 finds itself in a stable state, such as when OUT+ is much higher than OUT− during time interval 18 to 20, a DC current path exists from the reference node VDD to ground through devices Q5, Q1 and Q13 in FIG. 1. To reduce power consumption in this time interval, FIG. 2 shows the addition of device Q9 between node A and the drain of device Q1, and device Q10 between node B and the drain of device Q2. When node A has reached a stable point at a higher potential than node B, device Q10 will conduct such that node B and hence the gate of device Q9 will be pulled down towards the potential at ground (reference node VSS). As a result, device Q9 tends to conduct less current and will in fact cut off as its gate drops to a low enough potential. Thus, the output states at nodes A and B are preserved whereas the DC current path through device Q1 is impaired. Because the comparator circuit is symmetrical, device Q10 operates similar to device Q9, except that Q10 will tend to cut off current through device Q2 when node B is at a higher potential than node A.

As shown in the periodic waveforms of FIG. 3, the comparator circuit can be used to periodically make a comparison between the two input signals IN+ and IN− and provide a stable output signal typically within the period of time as measured between times 10 and 18, after reset signal RST falls. In one embodiment of this invention, ΔP=2 nanoseconds is approximately 10% of the period for RST, such that a comparison can be made every 10*ΔP=20 nanoseconds.

Figure 4:
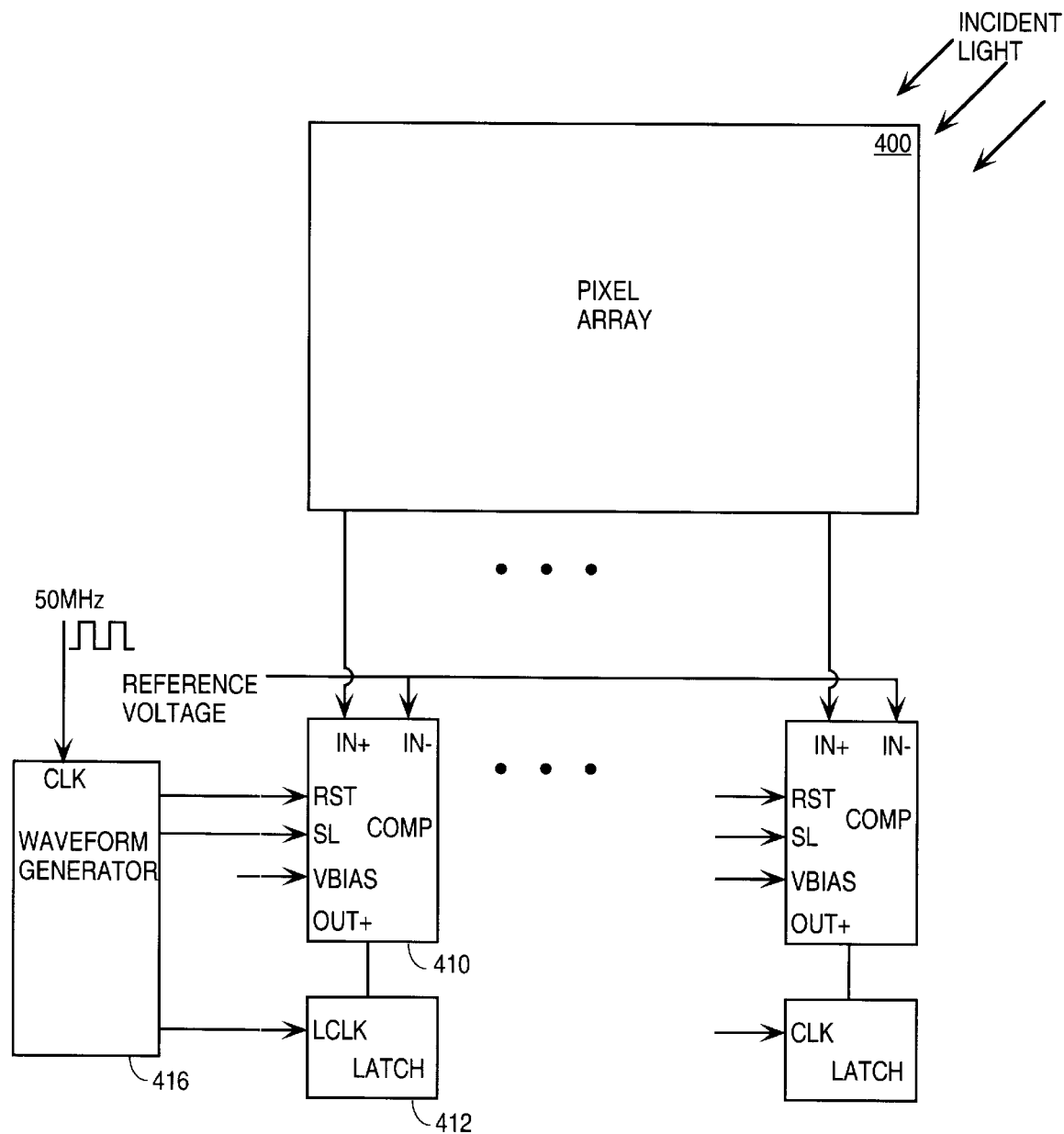
FIG. 4 shows an embedded circuit application utilizing a comparator according to one embodiment of the invention.

FIG. 4 shows a comparator of the invention utilized in an embedded circuit CMOS imaging application. A waveform generator portion 416 of the embedded circuit will create periodic waveforms RST, SL (described above with respect to FIG. 1), and LCLK which are applied to a series of comparators 410, one comparator for each column in pixel array 400. Comparator 410 can be the embodiment shown in either FIG. 1 or FIG. 2 or another embodiment suggested by the invention. The result of each comparison OUT+ will be stored in latch 412 in response to the LCLK signal, and will be read as needed by the application for purposes of A/D conversion of each column in the pixel array 400 in accordance with known techniques in the art.

Figure 5:
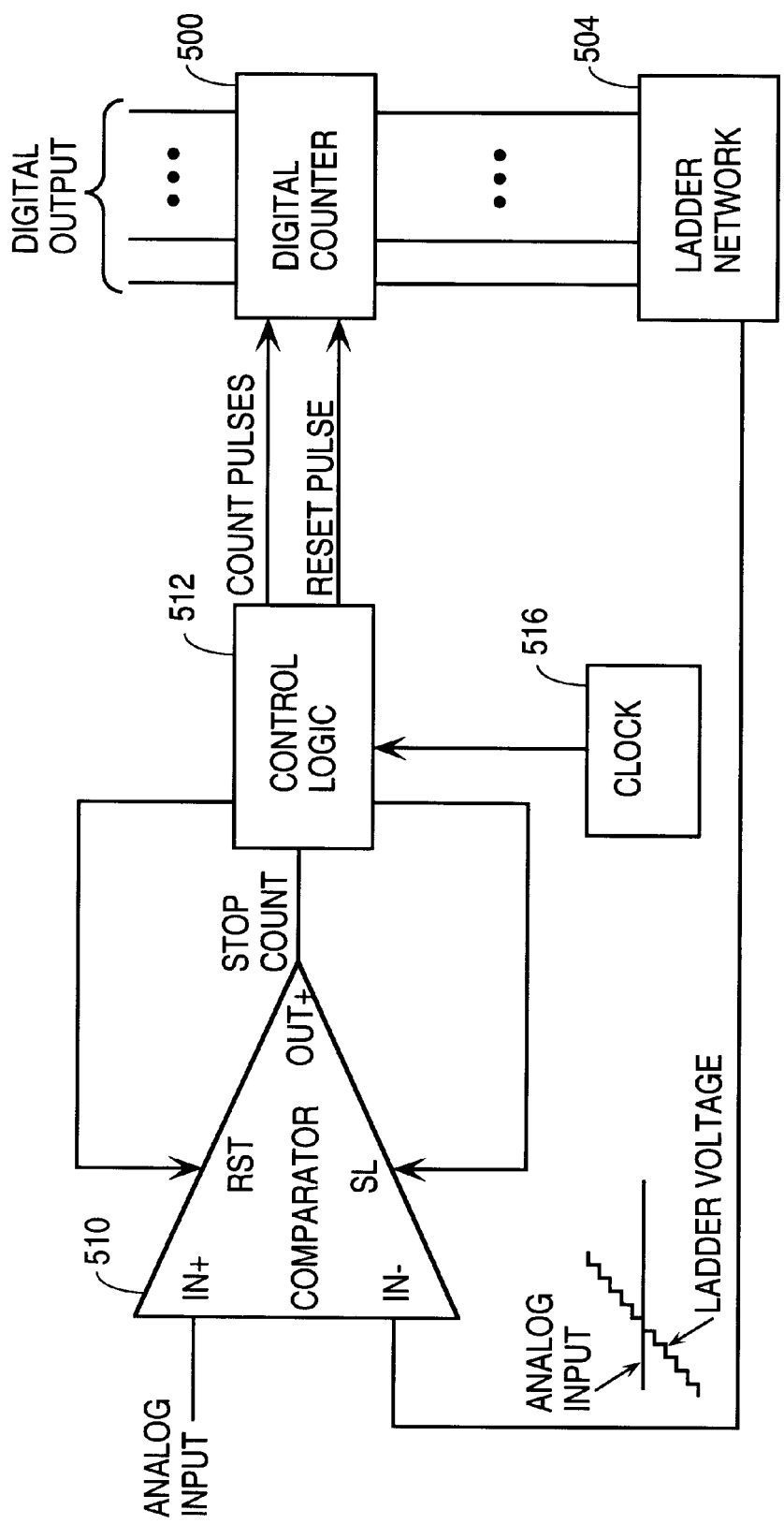
FIG. 5 is an A/D converter application utilizing a comparator according to one embodiment of the invention.

FIG. 5 is an A/D converter application utilizing a comparator according to the invention. A digital counter 500 advances from a zero count while a ladder network 504 driven by the counter outputs a stair case ladder voltage as shown. The comparator 510, receiving both ladder voltage and analog input voltage, provides a signal OUT+ to stop the count when the ladder voltage rises above the input voltage. Control logic 512 determines the count frequency based on the clock 516 and provides RST and SL signals to the comparator.

The various embodiments of the comparator circuit described above for exemplary purposes are, of course, subject to other variations in structure and timing within the capabilities of one reasonably skilled in the art. The details above are intended merely to illustrate principles of the invention and should not be construed as limiting the scope of the invention.

What is claimed is:

1. A circuit comprising:

an amplifier to receive first and second input signals and in response provide first and second output signals at first and second output terminals;

first load coupled to said first and second output terminals of the amplifier in a negative feedback configuration and to receive a set load signal, the first load being placed in a high impedance state in response to the set load signal being asserted;

a reset circuit coupled between said first and Second output terminals of the amplifier to equalize the first and second output signals in response to a reset signal being asserted;

a second load coupled to said first and second output terminals of the amplifier in a positive feedback configuration; and a power-saving circuit coupled to said first and second output terminals of the amplifier to automatically reduce the power consumption of the amplifier when a magnitude of the first output signal is greater than a magnitude of the second output signal.

2. A circuit as in claim 1 wherein the second load comprises a bistable circuit being a pair of cross-coupled transistors.

3. A circuit according to claim 1 wherein the amplifier comprises a differential pair.

4. A circuit according to claim 3 wherein the differential pair comprises first and second transistors each having a signal path and a control input, the power-saving circuit reduces a current through the signal path of the first transistor of said differential pair when the output signals diverge substantially.

5. A circuit according to claim 1 wherein the first load comprises a switching device for receiving the set load signal and, in response, placing the first load in said high impedance state.

6. A comparator comprising:

an amplifier to receive and amplify a pair of input signals to provide a differential output signal corresponding to first and second signals at first and second terminals;

a second load coupled to said first and second terminals of the amplifier in a positive feedback configuration;

a first load to receive a set load signal and being coupled to the first and second terminals of the amplifier in a negative feedback configuration in response to the set load signal being deasserted; and a power-saving circuit coupled to the first and second terminals of the amplifier to automatically reduce the power consumption of the amplifier when a magnitude of the first signal is greater than a magnitude of the second signal and the differential output signal settles to a substantially time invariant state.

7. A comparator according to claim 6 wherein the amplifier comprises a differential transistor pair to provide the differential output signal in response to the pair of input signals.

8. A comparator as in claim 6 wherein the second load comprises a bistable circuit being a pair of cross-coupled transistors.

9. The comparator of claim 6 further comprising:

a reset circuit coupled to the first and second terminals to receive a reset signal and to allow the amplifier to drive the output signal in response to the reset signal being deasserted.

10. A comparator according to claim 9 wherein the second load is decoupled from the amplifier in response to the set load signal being asserted after the reset signal is deasserted.

11. A comparator according to claim 10 wherein the set load signal is asserted when a predetermined time has elapsed after the reset signal is deasserted.

12. A comparator according to claim 6 wherein the power-saving circuit reduces a signal current through one transistor of said differential pair when the differential output signal has settled.

13. A method comprising:

applying a pair of input signals to a single amplifier configured to provide an output signal corresponding to first and second signals at first and second terminals indicative of a difference between the input signals, the amplifier comprising a differential pair of transistors coupled to the first and second terminals each having a control input and a signal path, the amplifier having first and second loads and a third load all coupled to the first and second terminals, a power-saving circuit coupled between the differential pair and said first and second terminals to reduce the power consumption of said amplifier by automatically reducing a current through the signal path of one of the transistors in the differential pair in response to a magnitude of the first signal being greater than a magnitude of the second signal;

amplifying the input signals for a time using the amplifier and the first and second and third loads;

causing the first and second loads to enter a high impedance state after expiration of the time interval; and continuing to amplify the input signals with said third load until the output signal has reached the stable state.

14. A method according to claim 13 wherein the first and second loads are coupled to the differential pair to form a negative feedback configuration during the time interval.

15. A method according to claim 13 wherein the third load is coupled to the differential pair to form a positive feedback configuration after the time interval.

* * * * *